United States Patent
Osumi et al.

(10) Patent No.: US 12,136,589 B2
(45) Date of Patent: Nov. 5, 2024

(54) SEMICONDUCTOR DEVICE

(71) Applicant: ROHM CO., LTD., Kyoto (JP)

(72) Inventors: Yoshizo Osumi, Kyoto (JP); Taro Nishioka, Kyoto (JP); Tomohira Kikuchi, Kyoto (JP); Tsunehisa Ono, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 435 days.

(21) Appl. No.: 17/454,576

(22) Filed: Nov. 11, 2021

(65) Prior Publication Data

US 2022/0068776 A1    Mar. 3, 2022

Related U.S. Application Data

(63) Continuation of application No. PCT/JP2020/018144, filed on Apr. 28, 2020.

(30) Foreign Application Priority Data

Jun. 11, 2019 (JP) .................................. 2019-108677

(51) Int. Cl.
*H01L 23/495* (2006.01)
*H01L 23/00* (2006.01)
(Continued)

(52) U.S. Cl.
CPC ........ *H01L 23/49575* (2013.01); *H01L 24/32* (2013.01); *H01L 24/48* (2013.01);
(Continued)

(58) Field of Classification Search
CPC ... H01L 23/49575; H01L 24/32; H01L 24/48; H01L 24/49; H01L 24/73; H01L 24/29;
(Continued)

(56) References Cited

U.S. PATENT DOCUMENTS

2012/0153444 A1* 6/2012 Haga ................. H01L 24/85
                                                       257/737
2014/0302640 A1* 10/2014 Qin ..................... H01L 21/4825
                                                       438/108
(Continued)

FOREIGN PATENT DOCUMENTS

JP    H05-067708 A    3/1993
JP    H06-112370      4/1994
(Continued)

OTHER PUBLICATIONS

Office Action issued for Japanese Patent Application No. 2021-525939, Feb. 13, 2024, 6 pages including machine translation.
(Continued)

*Primary Examiner* — Marc Anthony Armand
(74) *Attorney, Agent, or Firm* — HSML P.C.

(57) ABSTRACT

A semiconductor a first device includes semiconductor chip and a second semiconductor chip to which different power-supply voltages are supplied, connection bonding wires connecting the first semiconductor chip and the second semiconductor chip to each other, and a sealing resin provided to fill a gap between a first lead frame on which the first semiconductor chip is mounted and a second lead frame on which the second semiconductor chip is mounted so as to cover the respective circumferences of the first semiconductor chip and the second semiconductor chip. The respective surfaces of the first lead frame and the second lead frame in the regions opposed to each other are covered with an
(Continued)

insulating protection film including a material having higher electrical breakdown voltage than a material included in the sealing resin.

9 Claims, 11 Drawing Sheets

(51) Int. Cl.
  *H01L 25/065* (2023.01)
  *H01L 25/07* (2006.01)
(52) U.S. Cl.
  CPC .............. *H01L 24/49* (2013.01); *H01L 24/73* (2013.01); *H01L 25/0655* (2013.01); *H01L 25/072* (2013.01); *H01L 2224/32245* (2013.01); *H01L 2224/48137* (2013.01); *H01L 2224/48245* (2013.01); *H01L 2224/4901* (2013.01); *H01L 2224/73265* (2013.01)
(58) Field of Classification Search
  CPC ..... H01L 24/45; H01L 24/92; H01L 25/0655; H01L 25/072
  See application file for complete search history.

(56) References Cited

U.S. PATENT DOCUMENTS

| | | | |
|---|---|---|---|
| 2016/0204046 | A1 | 7/2016 | Iwashige |
| 2016/0307854 | A1* | 10/2016 | Matsubara .............. H01L 24/49 |
| 2017/0278771 | A1 | 9/2017 | Kanai et al. |

FOREIGN PATENT DOCUMENTS

| | | |
|---|---|---|
| JP | H07-045755 A | 2/1995 |
| JP | 2005-005638 | 1/2005 |
| JP | 2010-80774 | 4/2010 |
| JP | 2015-050222 | 3/2015 |
| JP | 2016-207714 | 12/2016 |
| JP | 2017-183695 | 10/2017 |

OTHER PUBLICATIONS

Office Action issued for Japanese Patent Application No. 2021-525939, Oct. 3, 2023, 6 pages including English translation.
International Search Report and Written Opinion of PCT/JP2020/018144, Jul. 7, 2020, 9 pages including English translation of the International Search Report.

* cited by examiner

SEMICONDUCTOR DEVICE

CROSS REFERENCE TO RELATED APPLICATIONS AND INCORPORATION BY REFERENCE

This is a continuation application (CA) of PCT Application No. PCT/JP2020/018144, filed on Apr. 28, 2020, which claims priority to Japan Patent Application No. P2019-108677 filed on Jun. 11, 2019 and is based upon and claims the benefit of priority from prior Japanese Patent Application No. P2019-108677 filed on Jun. 11, 2019 and PCT Application No. PCT/JP2020/018144, filed on Apr. 28, 2020; the entire contents of each of which are incorporated herein by reference.

BACKGROUND OF THE INVENTION

1. Field of the Invention

The present disclosure relates to a semiconductor device sealed with resin.

2. Description of the Related Art

Semiconductor devices are widely known that drive switching elements such as an insulated gate bipolar transistor (IGBT) and a metal-oxide-semiconductor field-effect transistor (MOSFET). The semiconductor devices that drive switching elements are also called "gate drivers". Gate drivers include semiconductor chips that operate at a relatively low power-supply voltage (referred to below as "low-voltage-side chips") and semiconductor chips that operate at a relatively high power-supply voltage (referred to below as "high-voltage-side chips") to drive the switching elements.

For example, a gate driver is known that includes a low-voltage-side chip that operates at a power-supply voltage of about five volts with respect to a ground potential, and a high-voltage-side chip that operates at a power-supply voltage of about 1000 volts with respect to the ground potential and is controlled by the low-voltage-side chip so as to drive a switching element. Such a gate driver includes a transformer chip configured to convert an electrical signal output from the low-voltage-side chip into a magnetic force and further convert the magnetic force into an electrical signal to output the signal to the high-voltage-side chip. The indirect transmission of the electrical signal between the low-voltage-side chip and the high-voltage-side chip can prevent electrical breakdown of the low-voltage-side chip.

A semiconductor device is sealed with resin by molding, for example. The molding step may allow foreign matter to enter the sealing resin. The electrical breakdown may be caused in the low-voltage-side chip if foreign matter enters to adhere across a lead frame provided with the low-voltage-side chip and a lead frame provided with the high-voltage-side chip. The electrical breakdown may also be caused in the low-voltage-side chip if foreign matter enters between the low-voltage-side chip or a bonding wire in contact with the low-voltage-side chip and a bonding wire in contact with the high-voltage-side chip.

SUMMARY OF THE INVENTION

An aspect of one or more embodiments provides a semiconductor device including a first semiconductor chip and a second semiconductor chip to which different power-supply voltages are supplied, a first lead frame on which the first semiconductor chip is mounted, a second lead frame on which the second semiconductor chip is mounted, a connection bonding wire electrically connecting the first semiconductor chip and the second semiconductor chip to each other, a sealing resin covering the first semiconductor chip and the second semiconductor chip, and an insulating protection film including a material having higher electrical breakdown voltage than a material included in the sealing resin and covering surfaces of the first lead frame and the second lead frame in regions opposed to each other.

DETAILED DESCRIPTION OF THE INVENTION

An embodiment of the present disclosure is described below with reference to the drawings. The same or similar elements illustrated in the drawings are denoted below by the same or similar reference numerals. It should be understood that the drawings are illustrated schematically, and the relationships between the thicknesses and the planar dimensions or the proportions of the thicknesses of the respective elements in the drawings are not drawn to scale. It should also be understood that the dimensional relationships or proportions between the respective drawings can differ from each other.

The embodiment described below illustrates a device and a method for embodying the technical idea of the present disclosure, but the embodiment is not intended to be limited to the shapes, structures, or arrangements of the constituent elements as described herein. The embodiment can be variously modified within the technical scope of the appended claims.

Figure 1:
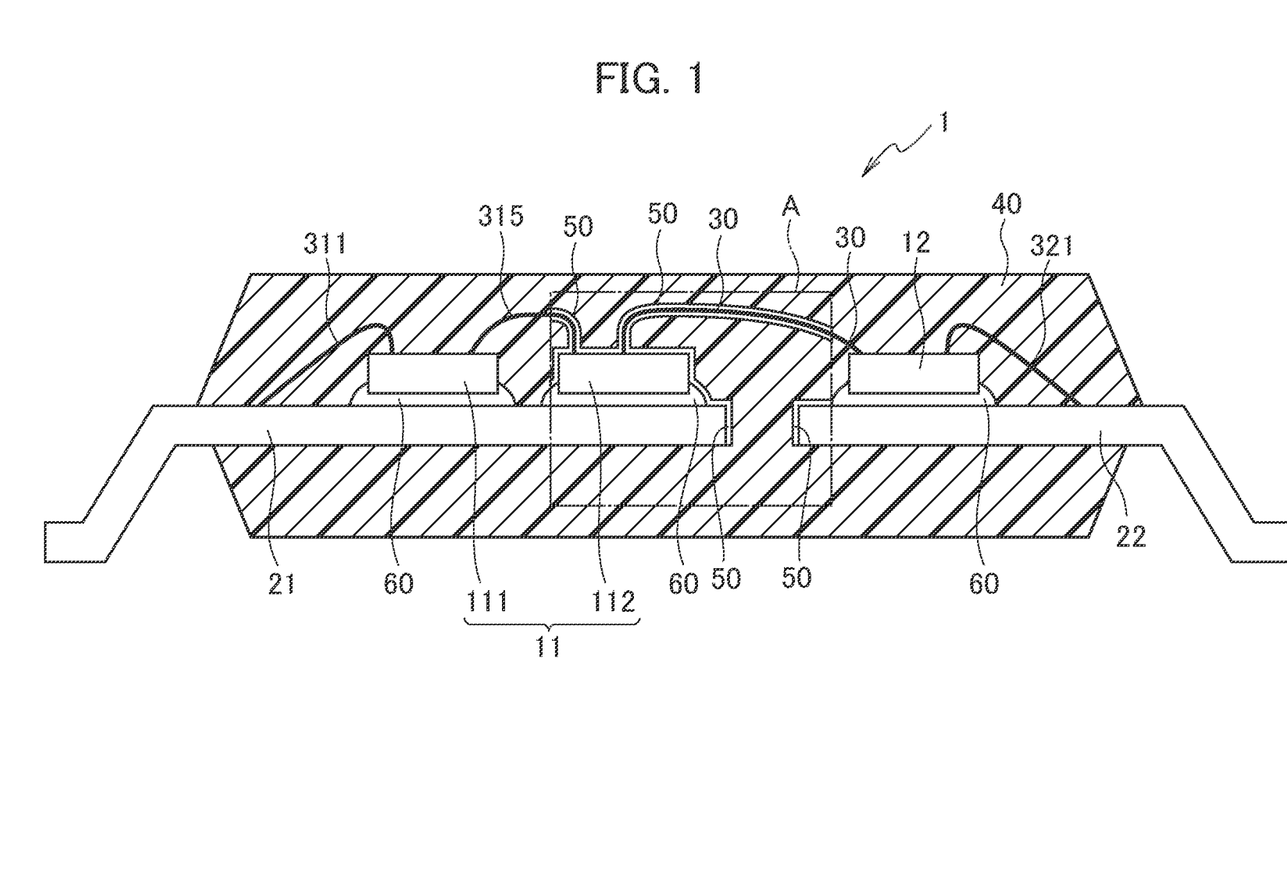
FIG. 1 is a schematic side view illustrating a configuration of a semiconductor device according to an embodiment.

A semiconductor device 1 according to the embodiment includes a first semiconductor chip 11 that operates when a first power-supply voltage is supplied thereto, and a second semiconductor chip 12 that operates when a second power-supply voltage having a higher potential than the first power-supply voltage is supplied thereto, as illustrated in FIG. 1. The first semiconductor chip 11 is a low-voltage-side chip that operates with the power-supply voltage of about 5 V to 20 V with respect to a ground potential, for example. The second semiconductor chip 12 is a high-voltage-side chip that operates with the power-supply voltage of about 600 V to 1000 V with respect to the ground potential, for example. As used herein, a region to which the first power-supply voltage having a relatively low potential is supplied is referred to as a "low-voltage-side region", and a region to which the second power-supply voltage having a relatively high potential is supplied is referred to as a "high-voltage-side region".

The semiconductor device 1 illustrated in FIG. 1 includes a control chip 111 and a transformer chip 112 as the first semiconductor chip 11. The transformer chip 112 converts an electrical signal output from the control chip 111 into a magnetic force, and then converts the magnetic force into an electrical signal. The transformer chip 112 outputs the electrical signal converted from the magnetic force to the second semiconductor chip 12. The operation of the second semiconductor chip 12 is controlled by the electrical signal output from the control chip 111 so as to drive a switching element that operates at a high power-supply voltage. Namely, the semiconductor device 1 serves as a gate driver including the second semiconductor chip 12 that operates as a drive chip for driving the switching element.

The transformer chip 112 is interposed between the control chip 111 and the second semiconductor chip 12, as illustrated in FIG. 1. The transformer chip 112 is electrically connected to the second semiconductor chip 12 via a connection bonding wire 30.

For example, the transformer chip 112 has a configuration including a receiving-side inductor that converts the electrical signal output from the control chip 111 into the magnetic force, and a sending-side inductor that converts the magnetic force into the electrical signal to output the signal to the second semiconductor chip 12. The indirect transmission of the electrical signal between the control chip 111 and the second semiconductor chip 12 can prevent electrical breakdown of the control chip 111 caused by the high voltage supplied to the second semiconductor chip 12.

The first semiconductor chip 11 is mounted on a chip mount surface of a first lead frame 21. The control chip 111 and the transformer chip 112 are each fixed to the first lead frame 21 via a die attachment 60. The second semiconductor chip 12 is mounted on a chip mount surface of a second lead frame 22. The second semiconductor chip 12 is fixed to the second lead frame 22 via the die attachment 60. A preferable example of material used for the die attachment 60 is silver paste.

The electrical signal output from the control chip 111 is input to the transformer chip 112 via a coupling bonding wire 315. The electrical signal output from the transformer chip 112 is then transmitted to the second semiconductor chip 12 via the connection bonding wire 30.

The semiconductor device 1 illustrated in FIG. 1 is sealed with a sealing resin 40. The sealing resin 40 fills a gap between the first lead frame 21 and the second lead frame 22 to cover the circumferences of the first semiconductor chip 11, the second semiconductor chip 12, and the respective chip mount surfaces of the first lead frame 21 and the second lead frame 22. A first bonding wire 311 electrically connecting the control chip 111 and the first lead frame 21 to each other and a second bonding wire 321 electrically connecting the second semiconductor chip 12 and the second lead frame 22 to each other are also sealed with the sealing resin 40. The bonding wires used for the electrical connection with the first semiconductor chip 11 in the low-voltage-side region (such as the coupling bonding wire 315 and the first bonding wire 311) are referred to below as "low-voltage-side bonding wires 31". The bonding wires used for the electrical connection with the second semiconductor chip 12 in the high-voltage-side region (such as the connection bonding wire 30 and the second bonding wire 321) are referred to below as "high-voltage-side bonding wires 32".

A proximity region A illustrated in FIG. 1 is a region in which the low-voltage-side region and the high-voltage-side region are opposed and proximate to each other. In the semiconductor device 1, the respective surfaces of the first lead frame 21 and the second lead frame 22 in the regions opposed to each other are covered with an insulating protection film 50 inside the sealing resin 40. In particular, the surface of the first lead frame 21 in the region opposed to the second lead frame 22 and the surface of the second lead frame 22 in the region opposed to the first lead frame 21 in the proximity region A are covered with the insulating protection film 50. In addition, the surfaces of the first semiconductor chip 11 and the first lead frame 21 and the surface of the connection bonding wire 30 opposed to each other in the proximity region A are also covered with the insulating protection film 50. The semiconductor device 1 thus has the configuration in which the surfaces of the conductive members are covered with the insulating protection film 50 in the proximity region A. The insulating protection film 50 is made of material having higher electrical breakdown voltage than the sealing resin 40.

The sealing resin 40 to be used can be epoxy resin or silicone resin. An example of material used for the insulating protection film 50 is thermosetting aromatic poly (ether-amide-imide) containing aromatic hydrocarbon in a fundamental molecular structure. While epoxy resin typically used as a sealing resin in a semiconductor device has electrical breakdown voltage of about 40 V/mm, the thermosetting aromatic poly (ether-amide-imide) has electrical breakdown voltage of about 230 kV/mm.

The sealing resin 40 to be used may be resin containing filler, and the insulating protection film 50 to be used may be resin not containing filler or resin having a smaller content of filler than the sealing resin 40. Electric charges are accumulated at the interface between the filler and the resin, so as to reduce the electrical breakdown voltage of the resin containing the filler. The use of the resin for the insulating protection film 50 having the smaller content of the filler than the sealing resin 40 can lead the insulating protection film 50 to have higher electrical breakdown voltage than the sealing resin 40.

In addition, a material having lower hardness and softer than the sealing resin 40 is preferably used for the insulating protection film 50. Further, a material having high adhesion to the sealing resin 40 is preferably used for the insulating protection film 50.

Figure 2:
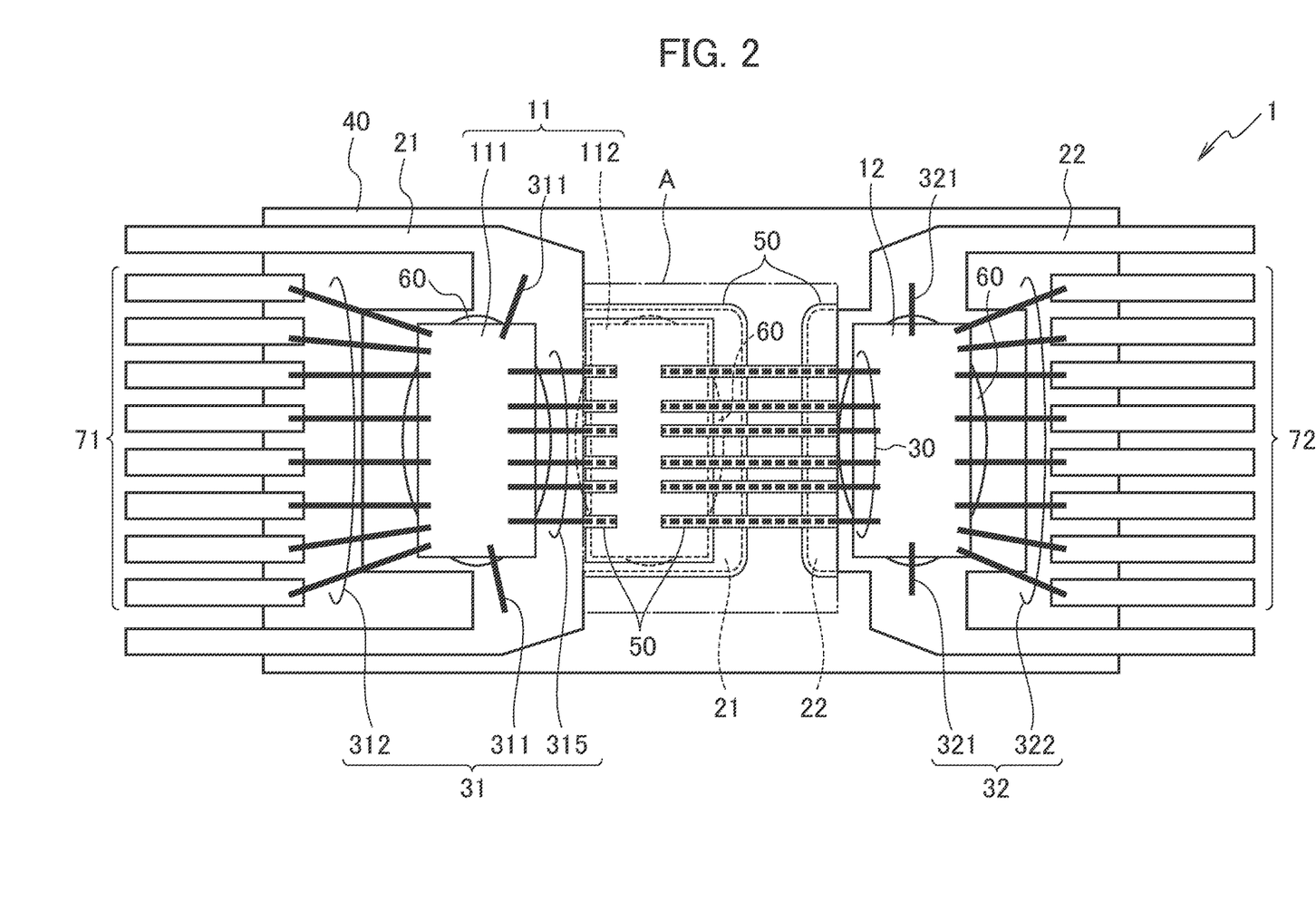
FIG. 2 is a schematic plan view illustrating the configuration of the semiconductor device according to the embodiment.

FIG. 2 is a plan view illustrating the semiconductor device 1 according to the embodiment. The semiconductor device 1 illustrated in FIG. 2 includes low-voltage-side lead terminals 71 and high-voltage-side lead terminals 72 each arranged inside the sealing resin 40 on one side and exposed to the outside of the sealing resin 40 on the other side. The respective low-voltage-side lead terminals 71 are electrically connected to the control chip 111 via first connection bonding wires 312. The respective high-voltage-side lead terminals 72 are electrically connected to the second semiconductor chip 12 via second connection bonding wires 322.

A material used for each of the first lead frame 21, the second lead frame 22, the low-voltage-side lead terminals 71, and the high-voltage-side lead terminals 72 is copper (Cu), for example. A material used for the respective bonding wires is gold (Au) or aluminum (Al), for example.

Figure 3:
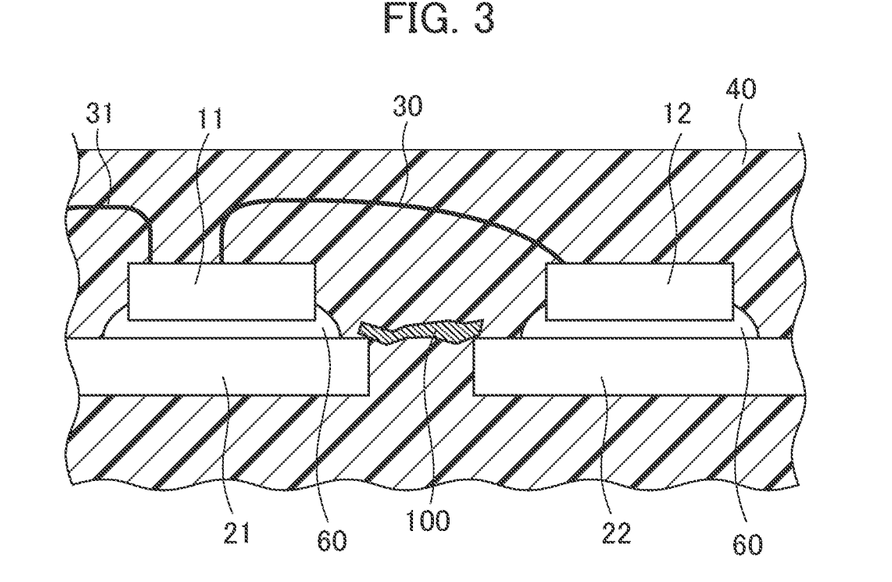
FIG. 3 is a schematic view showing an example of entrance of foreign matter.

The sealing resin 40 is formed by molding, for example. Foreign matter may enter the sealing resin 40 during the molding. For example, as illustrated in FIG. 3, conductive foreign matter 100 may enter the sealing resin 40 and cause a short circuit between the first lead frame 21 in the low-voltage-side region and the second lead frame 22 in the high-voltage-side region. If a high power-supply voltage is supplied to the second lead frame 22 in this case, the first semiconductor chip 11 mounted on the first lead frame 21 may cause electrical breakdown.

Figure 4:
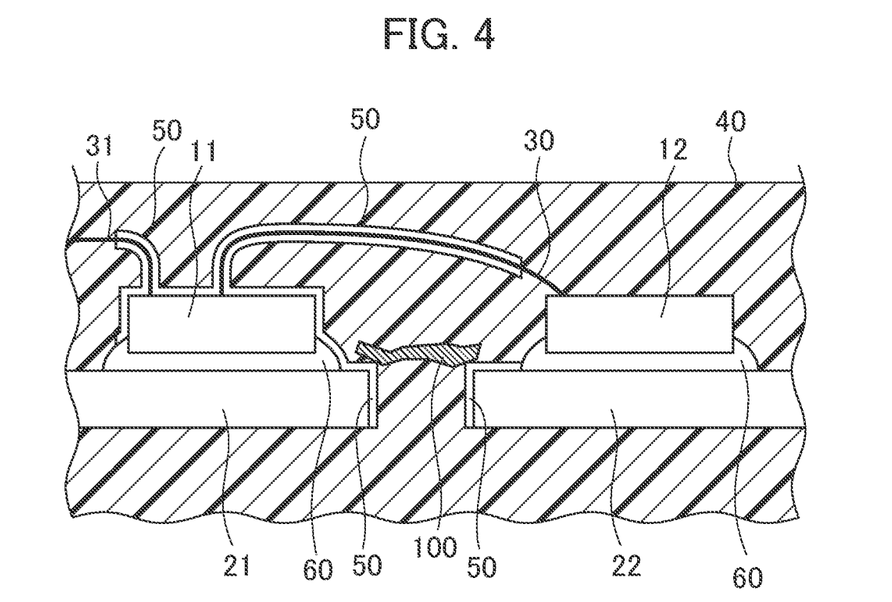
FIG. 4 is a schematic view showing an example of foreign matter in the semiconductor device according to the embodiment.

To deal with this, the semiconductor device 1 according to the embodiment includes the insulating protection film 50 made of material having higher electrical breakdown voltage than the sealing resin 40 and covering the surfaces of the first lead frame 21 and the second lead frame 22 in the regions opposed to each other, as illustrated in FIG. 4. The insulating protection film 50 thus can prevent the electrical breakdown of the first semiconductor chip 11 if the conductive foreign matter 100 enters the sealing resin 40 across the first lead frame 21 and the second lead frame 22.

The entrance of the foreign matter 100 between the low-voltage-side region and the high-voltage-side region may cause the electrical breakdown of the first semiconductor chip 11 because of a decrease in distance between the low-voltage-side region and the high-voltage-side region, regardless of the complete short circuit between the low-voltage-side region and the high-voltage-side region caused by the foreign matter 100. The covering of the opposing surfaces of the low-voltage-side region and the high-voltage-side region with the insulating protection film 50 can prevent the electrical breakdown of the first semiconductor chip 11 accordingly.

In addition, the adhesion of the foreign matter 100 to the first lead frame 21 or the second lead frame 22 decreases the adhesiveness between the first lead frame 21 or the second lead frame 22 and the sealing resin 40 regardless of whether the foreign matter 100 is a conductive body. The decrease in the adhesiveness further decreases the insulating property. The covering of the surfaces of the first lead frame 21 and the second lead frame 22 with the insulating protection film 50 can prevent the electrical breakdown of the first semiconductor chip 11.

Figure 5:
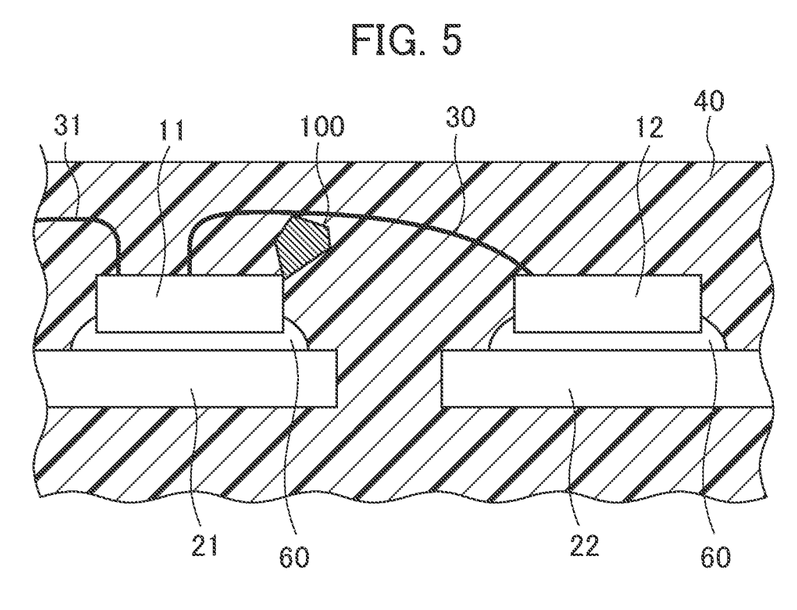
FIG. 5 is a schematic view showing another example of the entrance of the foreign matter.

The entrance of the foreign matter 100 not only between the first lead frame 21 and the second lead frame 22 but also between the connection bonding wire 30 and the first semiconductor chip 11, as illustrated in FIG. 5, may also cause the electrical breakdown of the first semiconductor chip 11.

The semiconductor device 1 has the configuration in which the surfaces of the first semiconductor chip 11 and the respective connection bonding wires 30 in the regions opposed to each other are covered with the insulating protection film 50, as described above. The surface of the die attachment 60 in the proximity region A is also covered with the insulating protection film 50 in the same manner as the first semiconductor chip 11. This configuration avoids the short circuit between the first semiconductor chip 11 and the respective connection bonding wires 30 caused by the foreign matter 100, so as to prevent the electrical breakdown of the first semiconductor chip 11 accordingly.

Figure 6:
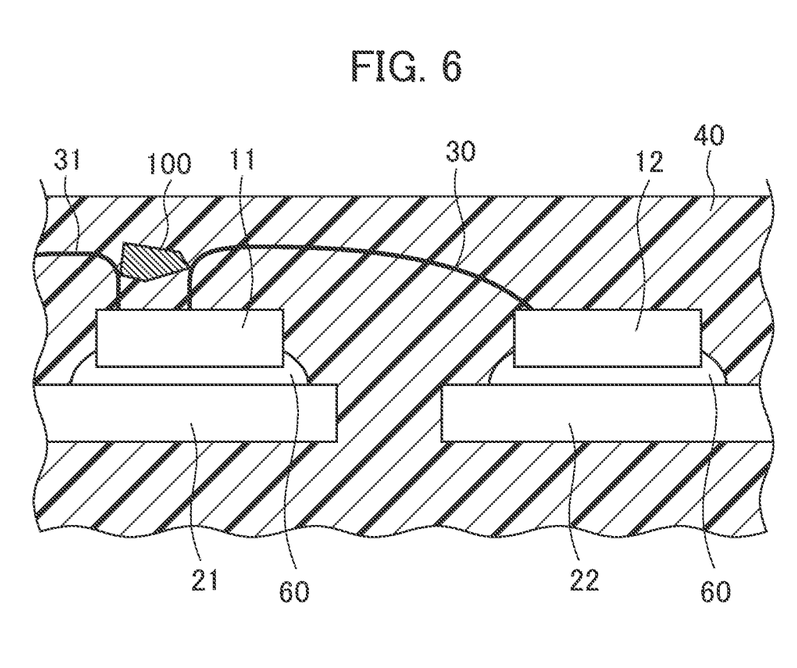
FIG. 6 is a schematic view showing still another example of the entrance of the foreign matter.

As illustrated in FIG. 6, the entrance of the foreign matter 100 between the connection bonding wire 30 and the low-voltage-side bonding wire 31 connected to the first semiconductor chip 11 may also cause the electrical breakdown of the first semiconductor chip 11.

The semiconductor device 1 has the configuration in which the surfaces of the connection bonding wires 30 and the other bonding wires connected to the first semiconductor chip 11 other than the connection bonding wires 30 in the respective regions opposed to each other are also covered with the insulating protection film 50. In particular, the region of the respective coupling bonding wires 315 adjacent to the connection bonding wires 30 and the region of the respective connection bonding wires 30 adjacent to the coupling bonding wires 315 in the proximity region A are covered with the insulating protection film 50. This configuration avoids the short circuit between the connection bonding wires 30 and the low-voltage-side bonding wires 31 derived from the entrance of the foreign matter 100, so as to prevent the electrical breakdown of the first semiconductor chip 11 accordingly.

The respective bonding wires could be brought into contact with each other if the bonding wires are bent during the process of molding the sealing resin 40. The configuration of the semiconductor device 1 described above can avoid the short circuit between the connection bonding wires 30 and the low-voltage-side bonding wires 31 if the respective bonding wires are brought into contact with each other because of the deformation.

A method of manufacturing the semiconductor device 1 illustrated in FIG. 1 is described below. The method of manufacturing the semiconductor device 1 described below is an example, and the semiconductor device 1 can be manufactured by any other methods including modified examples of this embodiment.

Figure 7:
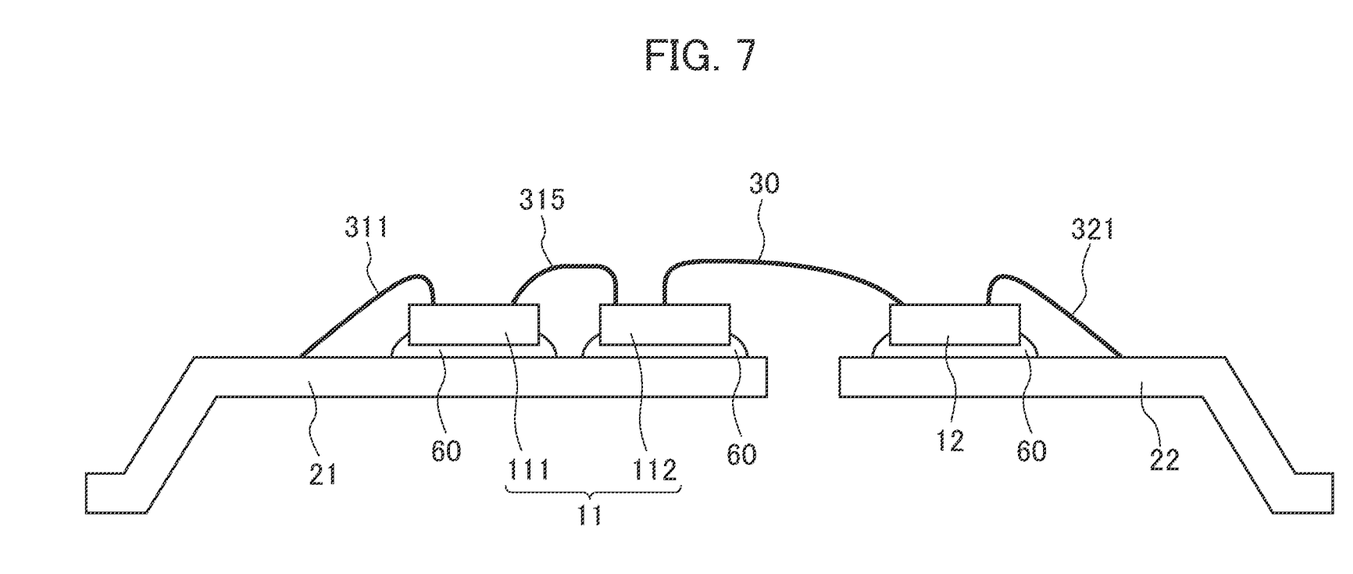
FIG. 7 is a schematic view for explaining a method of manufacturing the semiconductor device according to the embodiment (Part 1).

First, as illustrated in FIG. 7, a die attachment step and a wire bonding step are executed. In particular, the die attachment step fixes the control chip 111 and the transformer chip 112 to the chip mount surface of the first lead frame 21 with the die attachments 60. The die attachment step also fixes the second semiconductor chip 12 to the chip mount surface of the second lead frame 22 with the die attachment 60. The wire bonding step connects the first lead frame 21 and the control chip 111 to each other via the first bonding wires 311, and connects the second lead frame 22 and the second semiconductor chip 12 to each other via the second bonding wires 321. The wire bonding step also connects the control chip 111 and the transformer chip 112 to each other via the coupling bonding wires 315, and connects the transformer chip 112 and the second semiconductor chip 12 to each other via the connection bonding wires 30.

Figure 8:
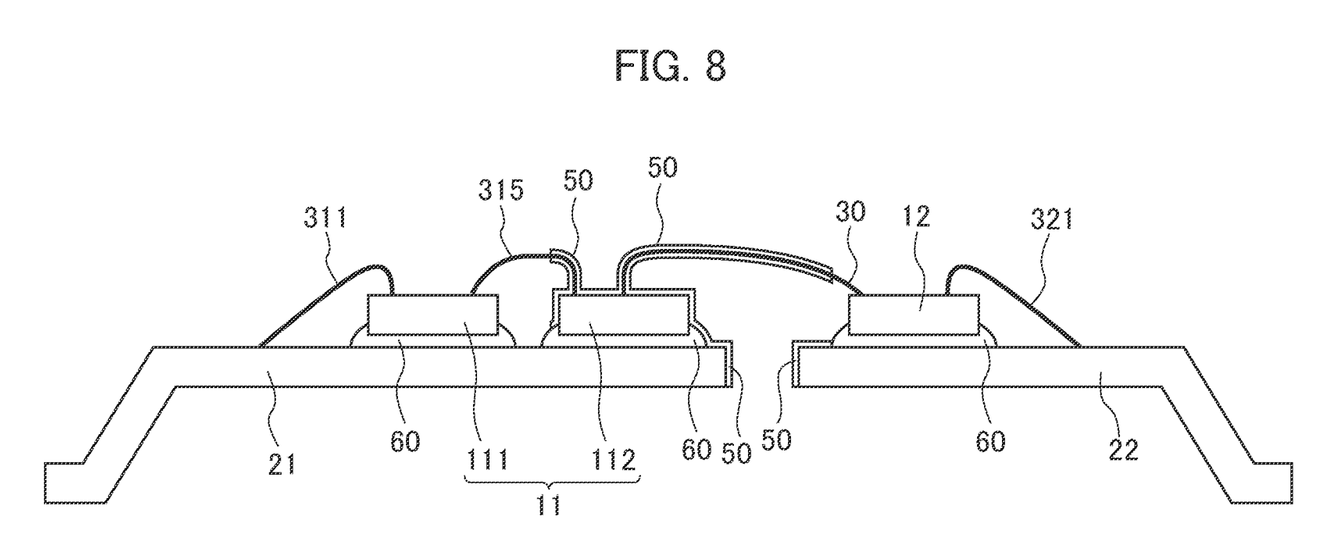
FIG. 8 is a schematic view for explaining the method of manufacturing the semiconductor device according to the embodiment (Part 2).

Next, as illustrated in FIG. 8, the insulating protection film 50 is provided on the respective surfaces of the corresponding members included in the proximity region A. In particular, the insulating protection film 50 is formed to cover the surfaces of the first lead frame 21 and the second lead frame 22 in the respective regions opposed to each other and cover the surfaces of the first semiconductor chip 11, the first lead frame 21, and the connection bonding wires 30 in the respective regions opposed to each other. For example, the material of the insulating protection film 50 in a liquid state is dropped in the proximity region A and is then cured so as to form the insulating protection film 50.

Figure 9:
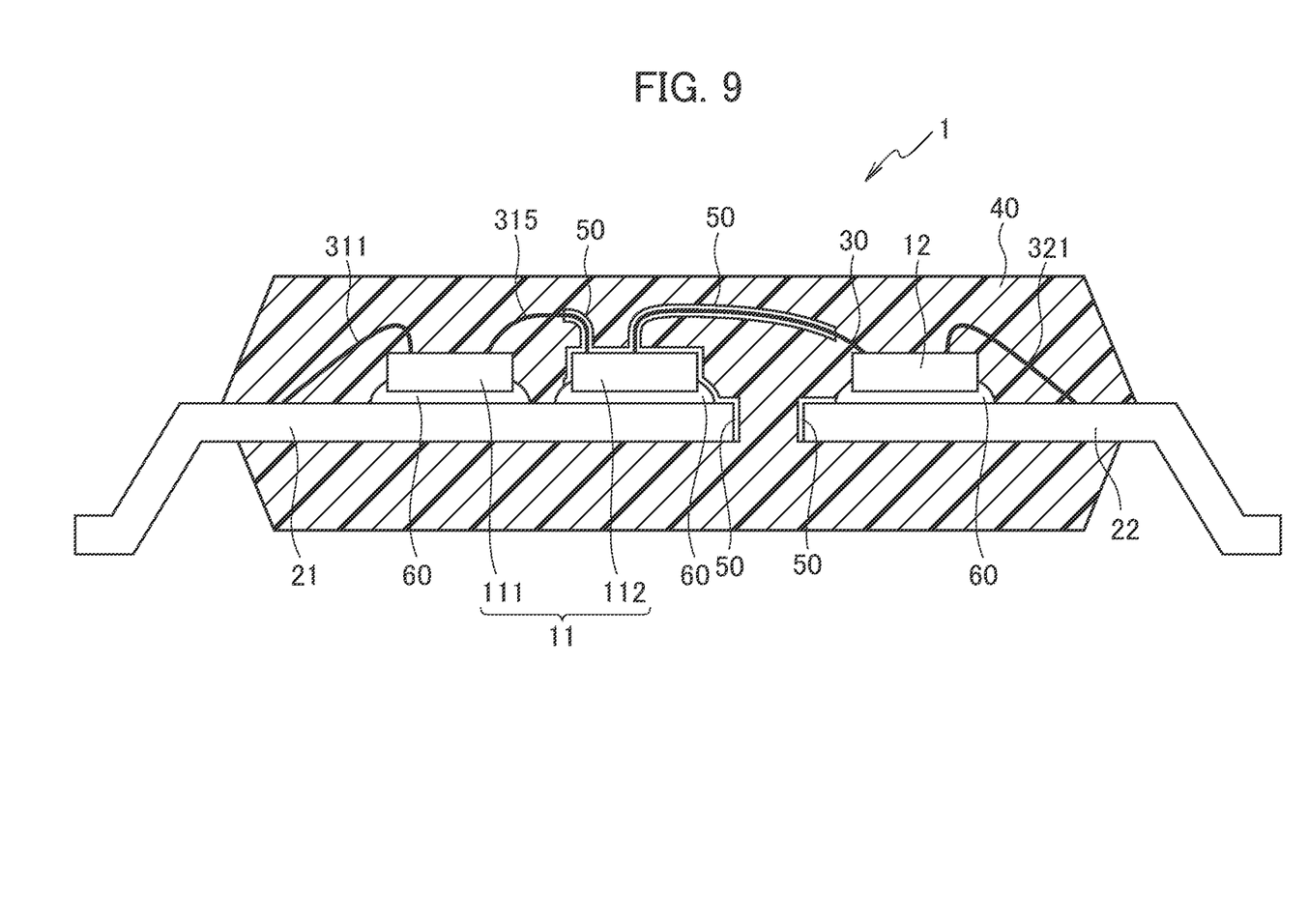
FIG. 9 is a schematic view for explaining the method of manufacturing the semiconductor device according to the embodiment (Part 3).

Next, as illustrated in FIG. 9, the sealing resin 40 is formed in the predetermined regions in the semiconductor device 1 by molding. In particular, the sealing resin 40 is provided to fill the gap between the first lead frame 21 and the second lead frame 22 to cover the circumferences of the first semiconductor chip 11, the second semiconductor chip 12, and the respective chip mount surfaces of the first lead frame 21 and the second lead frame 22. These steps complete the semiconductor device 1 as illustrated in FIG. 1.

Figure 10:
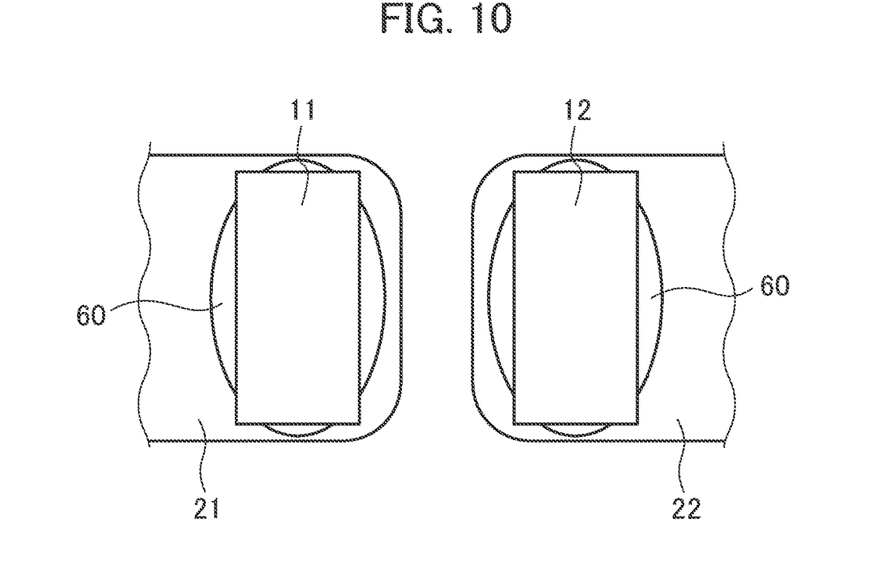
FIG. 10 is a schematic view showing an example of a shape of lead frames of the semiconductor device according to the embodiment.

As illustrated in FIG. 10, the corners made between the respective opposed side surfaces of the first lead frame 21 and the second lead frame 22 opposed to each other and the other side surfaces continuously integrated with the opposed side surfaces are preferably rounded off as viewed in the plane normal direction of the respective chip mount surfaces. Rounding off the respective corners of the first lead frame 21 and the second lead frame 22 can reduce a concentration of an electric field at the respective corners, so as to improve the breakdown voltage of the semiconductor device. The respective corners of the first lead frame 21 and the second lead frame 22 may be chamfered instead.

Figure 11:
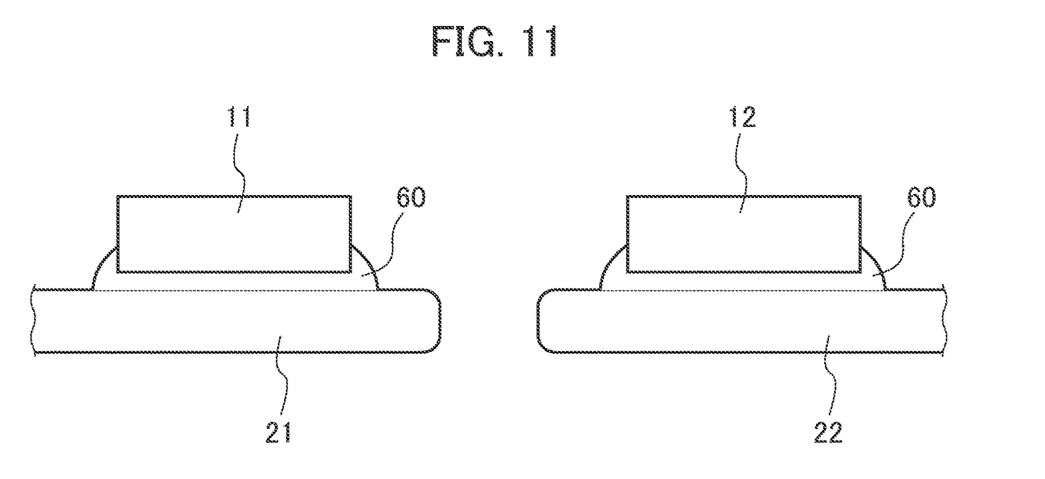
FIG. 11 is a schematic view showing another example of the shape of the lead frames of the semiconductor device according to the embodiment.

As illustrated in FIG. 11, the corners made between the respective opposed side surfaces of the first lead frame 21 and the second lead frame 22 opposed to each other and the respective main surfaces continuously integrated with the opposed side surfaces are preferably rounded off. In particular, the corners made between the top surfaces on which the semiconductor chips are mounted and the opposed side surfaces are preferably rounded off, and the corners made between the bottom surfaces on the opposite side of the top surfaces and the opposed side surfaces are preferably rounded off. Rounding off the respective corners can reduce the concentration of the electric field at the corners of the first lead frame 21 and the second lead frame 22, so as to improve the breakdown voltage of the semiconductor device.

Figure 12:
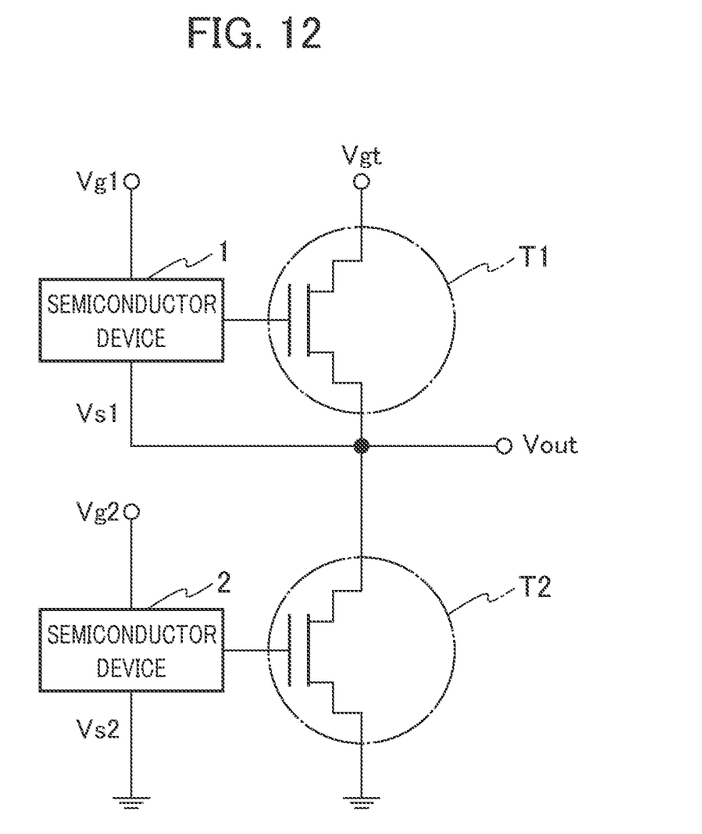
FIG. 12 is a circuit diagram using the semiconductor device according to the embodiment.

FIG. 12 is a diagram illustrating an example of a circuit using the semiconductor device 1 according to the embodiment. The circuit illustrated in FIG. 12 includes a first transistor T1 and a second transistor T2 that are cascade-connected between a power-supply voltage Vgt and a ground potential. The power-supply voltage Vgt connected to the first transistor T1 is in a range of 600 V to 1000 V. Turning ON/OFF the first transistor T1 and the second transistor T2 sets a potential Vout of an output terminal that is a connection point between the first transistor T1 and the second transistor T2. The first transistor T1 and the second transistor T2 are each an IGBT or a MOSFET, for example.

The operation of the second transistor T2 is controlled by a semiconductor device 2. A second reference potential Vs2 of the semiconductor device 2 is the ground potential, and a second power-supply voltage Vg2 is supplied to the semiconductor device 2. The potential of the second power-supply voltage Vg2 is in a range of about 5 V to 20 V.

The semiconductor device 1 controls the operation of the first transistor T1. A first reference potential Vs1 is set to the potential Vout of the output terminal, and a first power-supply voltage Vg1 is supplied to the semiconductor device 1. A potential difference between the first reference potential Vs1 and the first power-supply voltage Vg1 is in a range of about 5V to 20 V, for example. The first reference potential Vs1 is low when the second transistor T2 is turned ON and the first transistor T1 is in the OFF state. The first reference potential Vs1 when the first transistor T1 is turned ON and the second transistor T2 is in the OFF state is as high as about 600 V to 1000 V that depends on the power-supply voltage Vgt. The power-supply voltage supplied to the second semiconductor chip 12 that drives the first transistor T1 is thus high, as described above.

The semiconductor device 1 in the circuit illustrated in FIG. 12 drives the first transistor T1 connected to the power-supply voltage Vgt of 1000 V, for example. The electrical signal is then transmitted between the first semiconductor chip 11 and the second semiconductor chip 12 via the transformer chip 112 that converts between the electrical signal and the magnetic force. This can prevent the electrical breakdown of the first semiconductor chip 11.

A preferable example of the transformer chip 112 to be used is an inductor-coupled-type isolator including a pair of inductors (coils) of the receiving-side inductor and the sending-side inductor that are inductively coupled with each other so as to transmit the electrical signal in the isolated state therebetween. The inductor-coupled-type isolator has a configuration in which the receiving-side inductor converts the electrical signal into the magnetic force, and the sending-side inductor converts the converted magnetic force into the electrical signal.

Figure 13:
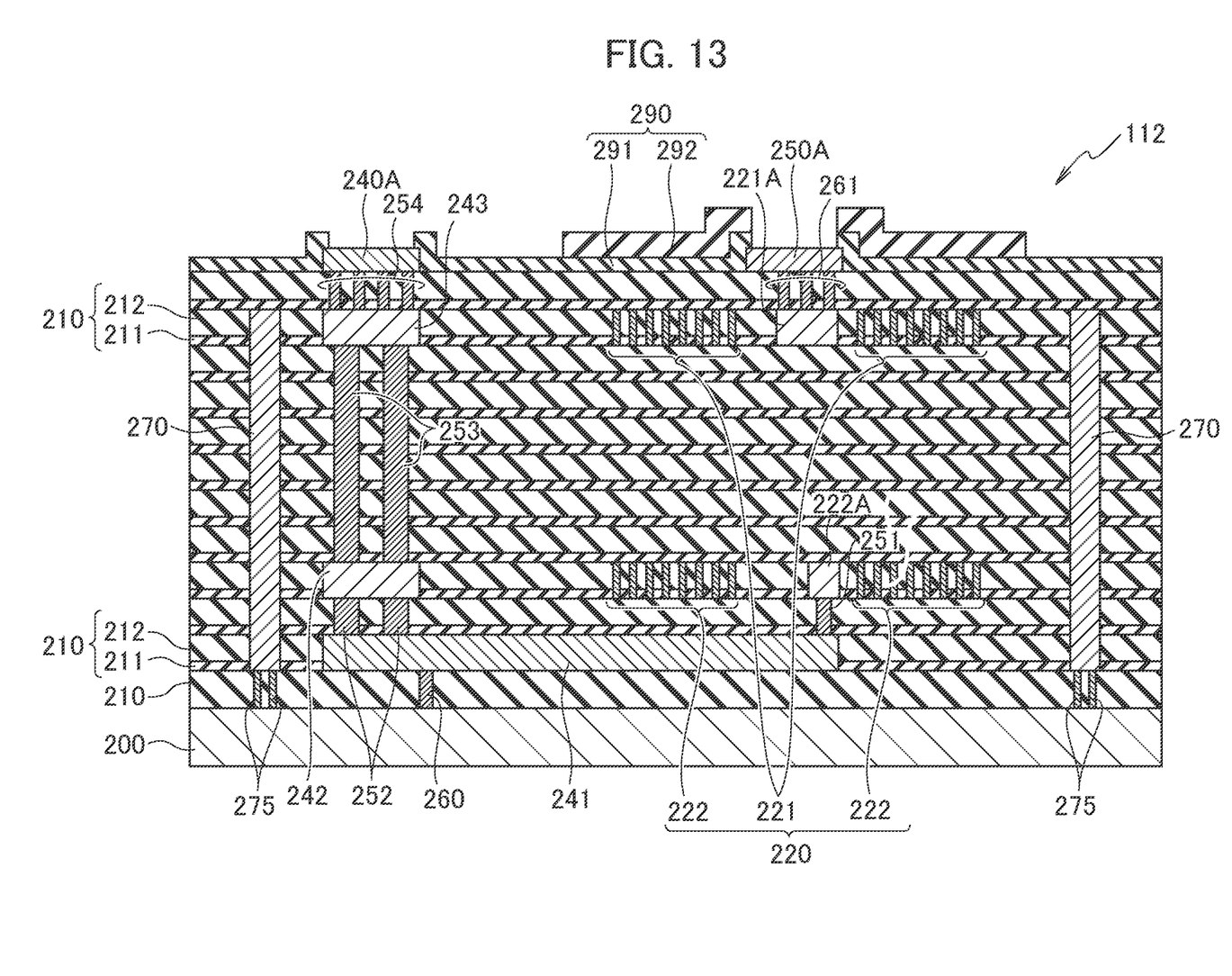
FIG. 13 is a schematic cross-sectional view illustrating a configuration of a transformer chip of the semiconductor device according to the embodiment.

FIG. 13 illustrates a configuration of the transformer chip 112. The transformer chip 112 includes a plurality of isolating layers 210 stacked on a semiconductor substrate 200. The semiconductor substrate 200 is a silicon substrate or a silicon carbide substrate, for example. FIG. 13 illustrates a case in which twelve isolating layers 210 are stacked on the semiconductor substrate 200. The number of the isolating layers 210 is not limited to twelve, and is determined depending on the breakdown voltage required for the transformer chip 112.

The isolating layers 210 each include an etching stopper film 211 as a lower layer and an interlayer film 212 as an upper layer stacked on one another. The etching stopper film 211 is a silicon nitride (SiN) film or a silicon carbide (Sic) film, for example. The interlayer film 212 is a silicon dioxide ($SiO_2$) film, for example. The lowermost isolating layer 210 does not include the etching stopper film 211 but only includes the interlayer film 212 that is directly deposited on the main surface of the semiconductor substrate 200. The etching stopper film 211 made of the SiN film has a tensile stress. The interlayer film 212 made of the $SiO_2$ film has a compressive stress. The etching stopper film 211 blocks a dispersion of Cu contained in a Cu wiring material described below toward the interlayer film 212.

A coil 220 including a pair of an upper coil 221 and a lower coil 222 is arranged in the transformer chip 112, as illustrated in FIG. 13. The upper coil 221 and the lower coil 222 are opposed to each other with the plural isolating layers 210 interposed therebetween. The upper coil 221 and the lower coil 222 are each a conductive body formed in a spiral having an oval shape in a planar view.

Figure 14:
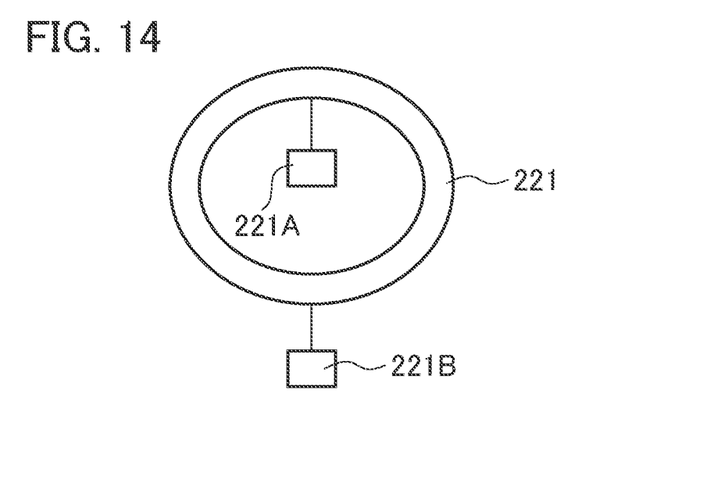
FIG. 14 is a schematic plan view illustrating a structure of an upper coil of the transformer chip.
Figure 15:
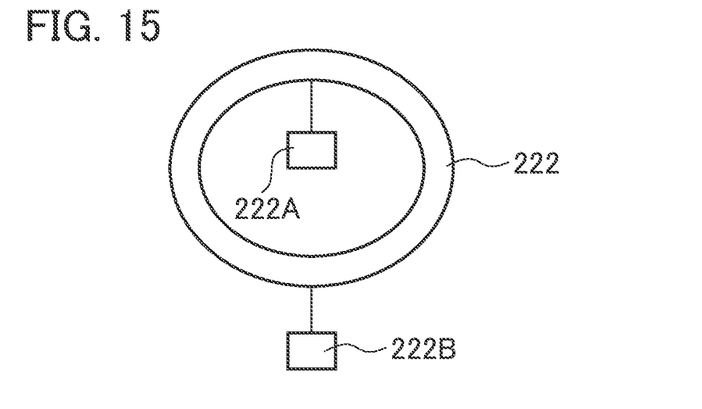
FIG. 15 is a schematic plan view illustrating a structure of a lower coil of the transformer chip.

As illustrated in FIG. 14, an upper-coil inner wire 221A connected to the inner edge of the upper coil 221 is arranged in the middle of the upper coil 221. An upper-coil outer wire 221B connected to the outer edge of the upper coil 221 is arranged on the outside of the upper coil 221. As illustrated in FIG. 15, a lower-coil inner wire 222A connected to the inner edge of the lower coil 222 is arranged in the middle of the lower coil 222. A lower-coil outer wire 222B connected to the outer edge of the lower coil 222 is arranged on the outside of the lower coil 222.

As illustrated in FIG. 13, the upper coil 221 and the lower coil 222 each penetrate one of the isolating layers 210 in the film thickness direction. FIG. 13 illustrates a case in which the lower coil 222 is arranged in the fourth isolating layer 210 from the semiconductor substrate 200, and the upper coil 221 is arranged in the eleventh isolating layer 210 from the semiconductor substrate 200. A material used for the upper coil 221 and the lower coil 222 is a Cu wiring material mainly containing Cu, for example. The upper coil 221 and the lower coil 222 may each be provided with a barrier metal layer of a stacked film including tantalum (Ta), tantalum nitride (TaN), and tantalum (Ta) on the respective side surfaces. The provision of the barrier metal layer blocks the dispersion of Cu contained in the Cu wiring material toward the interlayer film 212.

A low-voltage electrode layer 241 is arranged in the isolating layer 210 under the isolating layer 210 in which the lower coil 222 is arranged. The lower-coil inner wire 222A and the low-voltage electrode layer 241 are electrically connected to each other via a first low-voltage wire 251 having a pillar shape penetrating the isolating film 210 interposed therebetween. The low-voltage electrode layer 241 is electrically connected to the semiconductor substrate 200 via a ground wire 260.

A lower low-voltage wire 242 is arranged in the isolating layer 210 in which the lower coil 222 is arranged. The low-voltage electrode layer 241 and the lower low-voltage wire 242 are electrically connected to each other via second low-voltage wires 252 having a pillar shape penetrating the isolating film 210 interposed therebetween. An upper low-voltage wire 243 is arranged in the isolating layer 210 in which the upper coil 221 is arranged. The lower low-voltage wire 242 and the upper low-voltage wire 243 are electrically connected to each other via third low-voltage wires 253 having a pillar shape penetrating the isolating films 210 interposed therebetween.

A protection isolating film 290 is arranged on the top surface of the transformer chip 112. The protection isolating film 290 has a stacked structure including a passivation film 291 and a coil protection film 292 arranged on the upper surface of the passivation film 291. A low-voltage electrode 240A and a high-voltage electrode 250A are arranged separately from each other on the surface of the uppermost isolating layer 210 exposed on the openings provided in the protection isolating film 290. A material used for each of the low-voltage electrode 240A and the high-voltage electrode 250A is aluminum (Al), for example. The passivation film 291 has a stacked structure including a silicon dioxide film and a silicon nitride film, for example. The coil protection film 292 is a polyimide film, for example. The coil protection film 292 is arranged over the coil 220 to cover the coil 220 in the planar view.

The low-voltage electrode 240A is electrically connected to the upper low-voltage wire 243 located below via fourth low-voltage wires 254 having a pillar shape penetrating the isolating film 210 interposed therebetween. Namely, the low-voltage electrode 240A is electrically connected to the lower-coil inner wire 222A via the upper low-voltage wire 243, the lower low-voltage wire 242, the low-voltage electrode layer 241, and the first low-voltage wire 251 to the fourth low-voltage wires 254.

The high-voltage electrode 250A is electrically connected to the upper-coil inner wire 221A located below via high-voltage wires 261 having a pillar shape penetrating the isolating film 210 interposed therebetween.

As illustrated in FIG. 13, a shield layer 270 is arranged to surround the coil 220 and the respective wires connecting the coil 220 with the low-voltage electrode 240A and the high-voltage electrode 250A. The lower edge of the shield layer 270 is electrically connected to the semiconductor substrate 200 via shield ground wires 275. The respective wires and the shield layer 270 arranged inside the transformer chip 112 each have a stacked structure of Cu and a barrier metal layer, as in the case of the coil 220, for example.

Figure 16:
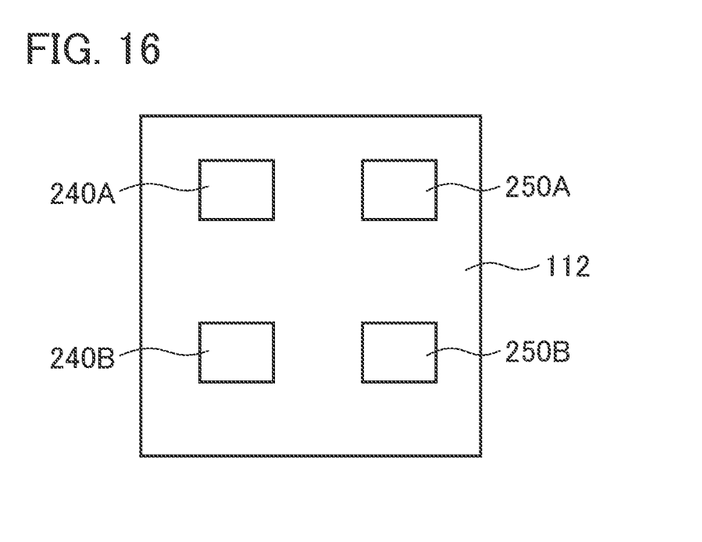
FIG. 16 is a schematic plan view illustrating an arrangement of electrodes in the transformer chip.

FIG. 16 is a plan view illustrating an example of arrangement of the electrodes in the transformer chip 112. A low-voltage electrode 240B illustrated in FIG. 16 is electrically connected to the lower coil via the respective wires arranged inside the transformer chip 112 (not illustrated in FIG. 16) in the same manner as the low-voltage electrode 240A connected to the lower-coil inner wire 222A. Similarly, a high-voltage electrode 250B is electrically connected to the upper coil via the respective wires arranged inside the transformer chip 112 (not illustrated in FIG. 16) in the same manner as the high-voltage electrode 250A connected to the upper-coil inner wire 221A.

The electrical signal output from the control chip 111 is input to the low-voltage electrode 240A and the low-voltage electrode 240B of the transformer chip 112 during the operation of the semiconductor device 1. The input electrical signal is converted into the magnetic force by the lower coil 222 provided inside the transformer chip 112. The magnetic force is further converted into the electrical signal by the upper coil 221 opposed to the lower coil 222. The converted electrical signal is output to the second semiconductor chip 12 via the high-voltage electrode 250A and the high-voltage electrode 250B of the transformer chip 112.

The transformer chip 112 described above includes the lower coil 222 that serves as the receiving-side inductor and the upper coil 221 that serves as the sending-side inductor. The arrangement of the transformer chip 112 thus avoids the direct transmission of the electrical signal between the control chip 111 and the second semiconductor chip 12. This configuration can prevent the electrical breakdown of the control chip 111 caused by the high voltage supplied to the second semiconductor chip 12.

While the present disclosure has been described above with reference to the embodiment, it should be understood that the embodiment is not intended to be limited to the descriptions and the drawings composing part of this disclosure. Various alternative embodiments, examples, and technical applications will be apparent to those skilled in the art according to this disclosure. It should also be understood that the present disclosure includes various embodiments not disclosed herein.

What is claimed is:

1. A semiconductor device comprising:
   a first semiconductor chip to which a first power-supply voltage is supplied;
   a second semiconductor chip to which a second power-supply voltage having a higher potential than the first power-supply voltage is supplied;
   a first lead frame including a chip mount surface on which the first semiconductor chip is mounted;

a second lead frame including a chip mount surface on which the second semiconductor chip is mounted;

a connection bonding wire electrically connecting the first semiconductor chip and the second semiconductor chip to each other;

a sealing resin provided to fill a gap between the first lead frame and the second lead frame to cover a circumference of each of the first semiconductor chip, the second semiconductor chip, and the respective chip mount surfaces of the first lead frame and the second lead frame; and an insulating protection film including a material having higher electrical breakdown voltage than a material included in the sealing resin and arranged to cover surfaces of the first lead frame and the second lead frame in regions opposed to each other inside the sealing resin only in a proximity region where a low voltage side region to which the first power-supply voltage is applied and a high voltage side region to which the second power-supply voltage is applied are opposed to each other and are proximate to each other.

2. The semiconductor device according to claim 1, wherein the insulating protection film further covers surfaces of the first semiconductor chip and the first lead frame and a surface of the connection bonding wire in regions opposed to each other inside the sealing resin.

3. The semiconductor device according to claim 1, wherein the insulating protection film covers a surface of a bonding wire connected to the first semiconductor chip other than the connection bonding wire in a region opposed to the connection bonding wire.

4. The semiconductor device according to claim 1, wherein the material included in the insulating protection film is resin having a smaller content of filler than resin used as the material included in the sealing resin.

5. The semiconductor device according to claim 1, wherein the material included in the insulating protection film has lower hardness than the material included in the sealing resin.

6. The semiconductor device according to claim 1, wherein corners made between opposed side surfaces of the first lead frame and the second lead frame opposed to each other and other side surfaces continuously integrated with the opposed side surfaces are rounded off.

7. The semiconductor device according to claim 1, wherein corners made between opposed side surfaces of the first lead frame and the second lead frame opposed to each other and main surfaces continuously integrated with the opposed side surfaces are rounded off.

8. The semiconductor device according to claim 1, wherein:

the first semiconductor chip includes a control chip and a transformer chip configured to internally convert an electrical signal output from the control chip into a magnetic force and further convert the magnetic force into an electrical signal to output the converted electrical signal; and the second semiconductor chip to which the electrical signal output from the transformer chip is input operates as a drive chip controlled by the control chip so as to drive a switching element.

9. The semiconductor device according to claim 8, wherein:

the transformer chip is arranged at a position interposed between the control chip and the drive chip; and a surface of the transformer chip opposed to the drive chip and a surface of the connection bonding wire electrically connecting the transformer chip and the drive chip are covered with the insulating protection film.

* * * * *